United States Patent
Singh et al.

(10) Patent No.: US 10,802,397 B2
(45) Date of Patent: *Oct. 13, 2020

(54) MICROLITHOGRAPHIC FABRICATION OF STRUCTURES

(71) Applicant: Molecular Imprints, Inc., Austin, TX (US)

(72) Inventors: Vikramjit Singh, Pflugerville, TX (US); Kang Luo, Austin, TX (US); Michael Nevin Miller, Austin, TX (US); Shuqiang Yang, Austin, TX (US); Frank Y. Xu, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/811,033

(22) Filed: Mar. 6, 2020

(65) Prior Publication Data
US 2020/0278606 A1 Sep. 3, 2020

Related U.S. Application Data

(63) Continuation of application No. 16/356,836, filed on Mar. 18, 2019, now Pat. No. 10,585,350, which is a continuation of application No. 15/705,948, filed on Sep. 15, 2017, now Pat. No. 10,274,823.

(60) Provisional application No. 62/409,533, filed on Oct. 18, 2016.

(51) Int. Cl.
*G03F 7/20* (2006.01)
*G03F 7/00* (2006.01)

(52) U.S. Cl.
CPC .......... *G03F 7/0002* (2013.01); *G03F 7/7035* (2013.01)

(58) Field of Classification Search
CPC .............................. G03F 7/0002; G03F 7/7035
USPC ................... 355/77, 95; 425/174.4; 430/322; 977/887
See application file for complete search history.

(56) References Cited

U.S. PATENT DOCUMENTS

| 6,842,229 | B2 | 1/2005 | Sreenivasan et al. |
|---|---|---|---|
| 7,396,475 | B2 | 7/2008 | Sreenivasan |
| 7,473,090 | B2 | 1/2009 | McMackin et al. |
| 7,776,628 | B2 | 8/2010 | Colburn et al. |
| 8,215,946 | B2 | 7/2012 | GanapathiSubramanian |
| 8,268,220 | B2 | 9/2012 | Xu et al. |
| 10,274,823 | B2 | 4/2019 | Singh et al. |
| 10,585,350 | B2 | 3/2020 | Singh et al. |
| 2004/0065976 | A1 | 4/2004 | Sreenivasan et al. |
| 2008/0199816 | A1 | 8/2008 | Choi et al. |

(Continued)

FOREIGN PATENT DOCUMENTS

WO  WO 2014064228  5/2014

OTHER PUBLICATIONS

International Search Report and Written Opinion for International Application No. PCT/US2017/051850, dated Dec. 5, 2017, 11 pages.

(Continued)

*Primary Examiner* — Colin W Kreutzer
(74) *Attorney, Agent, or Firm* — Fish & Richardson P.C.

(57) ABSTRACT

Micro- and nano-patterns in imprint layers formed on a substrate and lithographic methods for forming such layers. The layers include a plurality of structures, and a residual layer having a residual layer thickness (RLT) that extends from the surface of the substrate to a base of the structures, where the RLT varies across the surface of the substrate according to a predefined pattern.

20 Claims, 9 Drawing Sheets

(56) References Cited

U.S. PATENT DOCUMENTS

| | | |
|---|---|---|
| 2009/0212012 A1 | 8/2009 | Brooks et al. |
| 2011/0277833 A1 | 11/2011 | Miller et al. |
| 2018/0107110 A1 | 4/2018 | Singh |
| 2019/0302611 A1 | 10/2019 | Singh et al. |

OTHER PUBLICATIONS

Jet and Flash™ Imprint Lithography (J-FIL™), Molecular Imprints, retrieved from <http://www.molecularimprints.com/technology-overview/j-fil-overview> on Jul. 6, 2016, 4 pages.

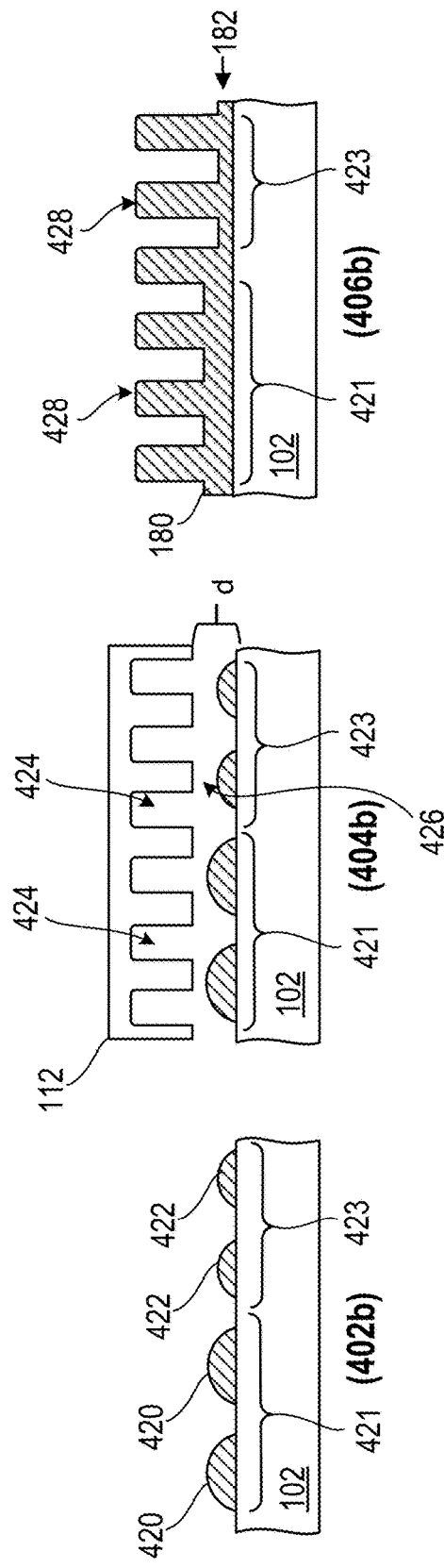
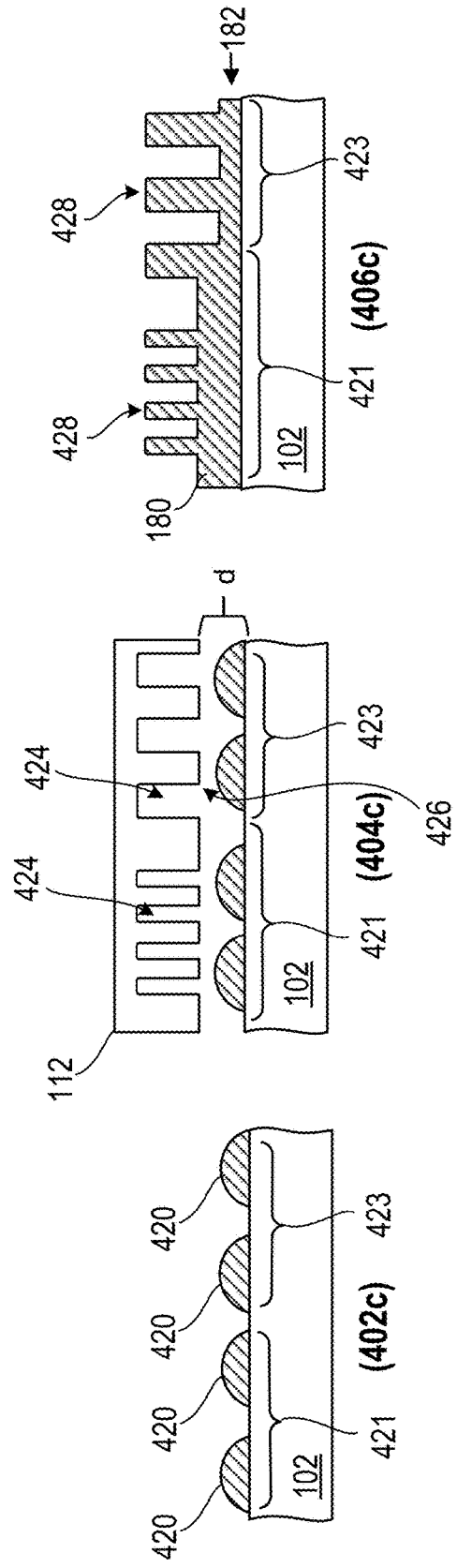
FIG. 4B
FIG. 4C

MICROLITHOGRAPHIC FABRICATION OF STRUCTURES

CROSS-REFERENCE TO RELATED APPLICATIONS

This application is a continuation of U.S. patent application Ser. No. 16/356,836, filed on Mar. 18, 2019, which is a continuation of U.S. patent application Ser. No. 15/705,948, filed on Sep. 15, 2017, now U.S. Pat. No. 10,274,823, which claims the benefit of the filing date of U.S. Provisional Application No. 62/409,533, filed on Oct. 18, 2016. The contents of U.S. application Ser. Nos. 16/356,836, 15/705,948, and 62/409,533 are incorporated herein by reference in their entirety.

TECHNICAL FIELD OF THE INVENTION

This invention relates to micro- and nano-structures having desired geometries, and to microlithographic methods of fabricating such structures.

BACKGROUND OF THE INVENTION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

Nano-fabrication can include processing of substrates to form a layer of material that include patterns of micro- and nano-structures on a substrate. One example process for forming such structures is imprint lithography.

SUMMARY OF THE INVENTION

This specification relates to forming micro- and nano-patterns in imprint layers that have a residual layer that varies in thickness and features with varying etch depths in a substrate. Such micro- and nano-patterns may, for example, be useful in fabricating more efficient diffraction patterns for optical waveguides. Implementations of the present disclosure include a method for fabricating imprint layers that have a varying thinness residual layer by selectively applying imprint fluid across the surface of a substrate in accordance with a predefined pattern. For example, the volume per unit area of the imprint fluid applied to a substrate surface can be varied in accordance with a pattern of desired variations in residual layer thickness. Implementations of the present disclosure also include a method for fabricating features with varying etch depths in a substrate using an imprint pattern with variations in residual layer thickness as a mask for etching a substrate.

In general, innovative aspects of the subject matter described in this specification can be embodied in methods that include the actions of dispensing an imprint fluid according to a predetermined pattern on a surface of a substrate. Contacting the imprint fluid with a surface of an imprint lithography template such that the imprint fluid fills features in the surface of the imprint lithography template. Solidifying the imprint fluid into a patterned layer, thereby forming, in the patterned layer: structures that correspond to the features of the imprint lithography template, and a residual layer having a residual layer thickness (RLT) that extends from the surface of the substrate to a base of a structure, wherein a first RLT of a first portion of the patterned layer is different from a second RLT of a second portion of the patterned layer. This and other implementations can each optionally include one or more of the following features.

In some implementations, an RLT in a region between the first portion and the second portion varies gradually from the first RLT to the second RLT. In some implementations, a change in RLT from the first RLT to the second RLT is a step change in a region between the first portion and the second portion.

In some implementations, dispensing the imprint fluid includes dispensing the imprint fluid in a pattern of drops, wherein a volume of drops dispensed across the surface of the substrate varies according to the predetermined pattern.

In some implementations, the pattern of drops corresponds to a fixed drop density in a predetermine region. In some implementations, the pattern of drops corresponds to a varying drop density in a predefined region.

In some implementations, dispensing the imprint fluid includes dispensing the imprint fluid with a jetting dispense system.

In some implementations, the method can include etching the patterned layer and the substrate, wherein a depth of features etched into the substrate varies according to variation in the RLT.

In some implementations, the features in the imprint lithography template have a uniform feature depth.

In some implementations, the imprint lithography template is a master template and, after etching, the substrate is a sub-master lithography template. In addition, the method can include dispensing a second imprint fluid on a surface of a second substrate, a volume of which is substantially uniform across the surface of the substrate. And, contacting the second imprint fluid with a surface of the sub-master template such that the imprint fluid fills features in the surface of the imprint lithography template, thereby forming, in the second imprint fluid, structures and a residual layer having a RLT that varies in accordance with variations in a dimension of features etched into the sub-master template.

In some implementations, the features in the imprint lithography template have a varying feature depth. In some implementations, the predetermined pattern corresponds with a diffraction efficiency output map.

In some implementations, the structures are nano-structures. In some implementations, the structures are micro-structures.

In some implementations, the difference between the first RLT and the second RLT is between 5 nm and 500 nm.

Another general aspect of the subject matter described in this specification can be embodied in methods that include the actions of dispensing imprint fluid on a surface of a substrate a volume of which varies across the surface of the substrate according to a predetermined pattern. Contacting the imprint fluid with a surface of an imprint lithography template such that the imprint fluid fills features in the surface of the imprint lithography template, thereby forming, in the imprint fluid, structures and a residual layer having a residual layer thickness (RLT) that extends from the surface of the substrate to a base of a structure, wherein the RLT varies across the surface of the substrate according to the volume per unit area of the imprint fluid.

In some implementations, dispensing the imprint fluid includes dispensing the imprint fluid in a predefined pattern that corresponds to a volume needed to fill the features in the imprint lithography template.

Another general aspect can be embodied in an optical device that includes a substrate, and a polymer imprint resist on a surface of the substrate. The polymer imprint resist includes a plurality of structures forming a diffraction pattern, and a residual layer having a residual layer thickness (RLT) that extends from the surface of the substrate to a base of a structure, wherein the RLT varies across the surface of the substrate according to a predefined pattern. This and other implementations can each optionally include one or more of the following features.

In some implementations, variations in the RLT correspond with a diffraction efficiency mapping of a different diffraction grating having a uniform RLT.

In some implementations, the polymer imprint resist is a Ultra Violet light curable Nano-Imprint Lithography (UV-NIL) resist.

Particular implementations of the subject matter described in this specification can be implemented so as to realize one or more of the following advantages. Implementations of the present disclosure permit the fabrication of micro- or nano-patterned layers that have varying residual layer thickness using imprint lithography processes. Implementations may permit the fabrication of patterns that have varying RLTs over different regions of a substrate (e.g., an Si wafer). Implementations may permit the fabrication of more efficient wave (e.g., optical) diffraction patterns. Implementations may permit large area fabrication of uniform (non-varying) RLT under a pattern of varying feature shape profiles, duty cycle, and pitch. Implementations may allow the patterning features into substrates which can then be used as sub-master templates for volume production.

As used herein, the terms "micro," "micro-structure," and "micro-feature" represent structures or features of a structure that have at least one dimension that is less than or equal to 50 micrometers.

As used herein, the terms "nano," "nano-structure," and "nano-feature" represent structures or features of a structure that have at least one dimension that is less than or equal to 500 nanometers.

As used herein, descriptions of volumes, patterns, or dimensions as being "equal," "substantially equal," the "same," "substantially the same," or "uniform" are not intended to indicate exactly equality in measurements. Instead, such descriptions are used to indicate similarity in volumes, patterns, or dimensions that are equivalent within reasonable error tolerances given the quality and precision of fabrication or measurement equipment being used in a particular case and/or reasonable error tolerances required to produce a particularly designed device or imprint lithography pattern.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF DRAWINGS

FIGS. 4B-4D illustrate several example variations to the process shown in FIG. 4A.

DETAILED DESCRIPTION

Various examples of fabricating micro- and nano-patterns in imprint layers that have a residual layer that varies in thickness and features with varying etch depths in a substrate. Such micro- and nano-patterns may, for example, be useful in fabricating more efficient diffraction patterns for optical waveguides. Generally, these examples include selectively applying imprint fluid across the surface of a substrate in accordance with a predefined pattern to fabricate imprint layers that have a residual layer that varies in thickness across the substrate. For example, the volume per unit area of the imprint fluid applied to a substrate surface can be varied in accordance with a pattern of desired variations in residual layer thickness. Implementations of the present disclosure also include fabricating features with varying etch depths in a substrate by using an imprint pattern with variations in residual layer thickness as a mask for etching a substrate.

Figure 1:
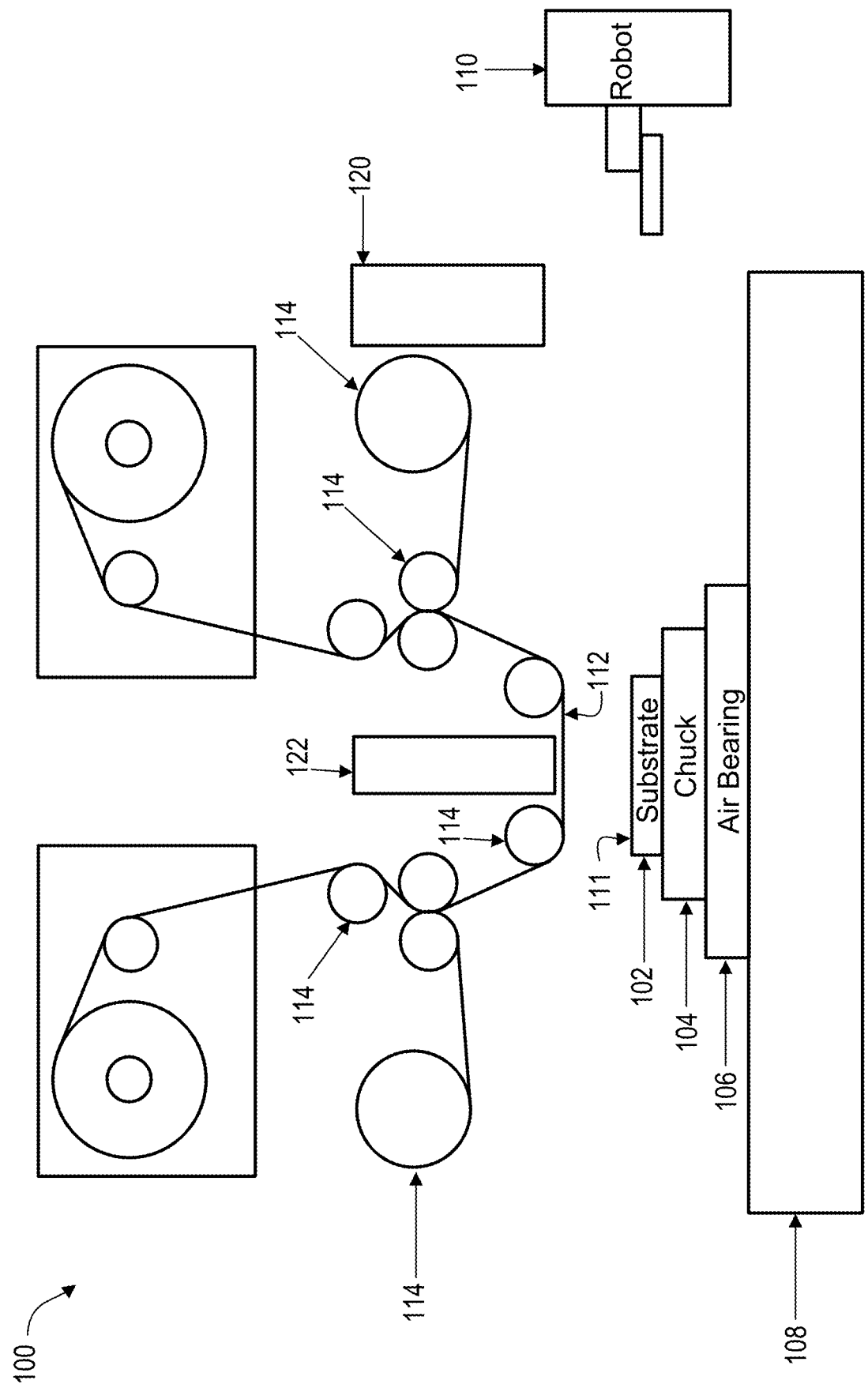
FIG. 1 illustrates a simplified side view of a lithographic system.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. In some examples, the substrate 102 and the substrate chuck 104 may be further positioned on an air bearing 106. The air bearing 106 provides motion about the x-, y-, and/or z-axes. In some examples, the substrate 102 and the substrate chuck 104 are positioned on a stage. The air bearing 106, the substrate 102, and the substrate chuck 104 may also be positioned on a base 108. In some examples, a robotic system 110 positions the substrate 102 on the substrate chuck 104.

The substrate 102 can include a planar surface 111 positioned opposite the substrate chuck 104. In some examples, the substrate 102 can be associated with a thickness that is substantially uniform (constant) across the substrate 102.

The imprint lithography system 100 includes an imprint lithography flexible template 112 that is coupled to one or more rollers 114, depending on design considerations. The rollers 114 provide movement of a least a portion of the flexible template 112. Such movement may selectively provide different portions of the flexible template 112 in superimposition with the substrate 102. In some examples, the flexible template 112 includes a patterning surface that includes a plurality of features, e.g., spaced-apart recesses and protrusions. However, in some examples, other configurations of features are possible. The patterning surface may define any original pattern that forms the basis of a pattern to be formed on substrate 102. In some examples, the flexible template 112 may be coupled to a template chuck, e.g., a vacuum chuck, a pin-type chuck, a groove-type chuck, an electromagnetic chuck, and/or the like.

The imprint lithography system 100 may further include a fluid dispense system 120. The fluid dispense system 120 can include, but is not limited to, a jetting dispense system, a spray dispense system, or a slot-die coating system. The fluid dispense system 120 may be used to deposit a polymerizable material (e.g., "imprint fluid") on the substrate 102. The polymerizable material may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material is positioned upon the substrate 102 as a plurality of droplets. For example, the fluid dispense system 120 can be a jetting dispense system that is configured to dispense droplets of polymerizable material according to predetermined patterns.

Figure 2:
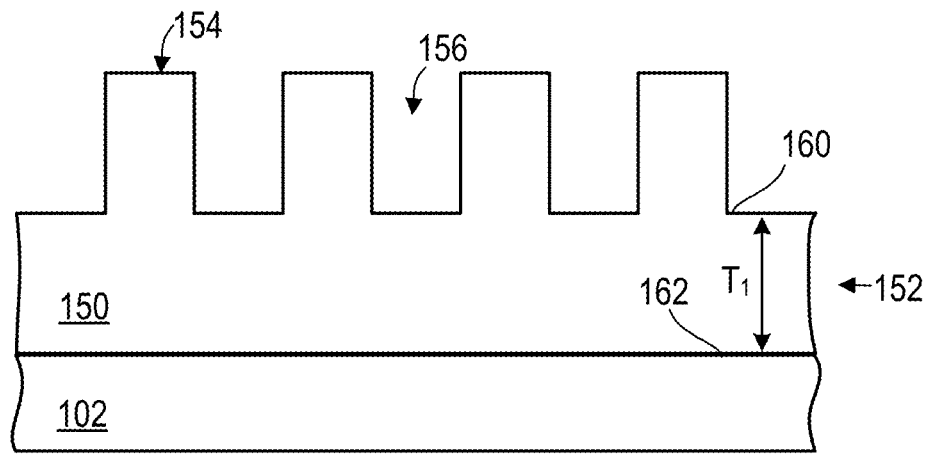
FIG. 2 illustrates a simplified side view of a substrate having a patterned layer positioned thereon.

Referring to FIGS. 1 and 2, the imprint lithography system 100 includes an energy source 122 coupled to direct energy towards the substrate 102. In some examples, the rollers 114 and the air bearing 106 are configured to position a desired portion of the flexible template 112 and the substrate 102 in a desired positioning. The imprint lithography system 100 may be regulated by a processor in communication with the air bearing 106, the rollers 114, the fluid dispense system 120, and/or the energy source 122, and may operate on a computer readable program stored in a memory.

In some examples, the rollers 114, the air bearing 106, or both, vary a distance between the flexible template 112 and the substrate 102 to define a desired volume therebetween that is filled by the polymerizable material. For example, the flexible template 112 contacts the polymerizable material. After the desired volume is filled by the polymerizable material, the energy source 122 produces energy, e.g., broadband ultraviolet radiation, causing the polymerizable material to solidify and/or cross-link conforming to shape of a surface of the substrate 102 and a portion of the patterning surface of the flexible template 112, defining a patterned layer 150 on the substrate 102. In some examples, the patterned layer 150 may comprise a residual layer 152 and a plurality of structures shown as protrusions 154 and recessions 156. The residual layer 152 has a residual layer thickness (RLT), $T_1$, which extends from the surface 158 of the substrate 102 to the base 160 of structures. The RLT is substantially uniform across the substrate (taking into account natural variations).

Figure 3:
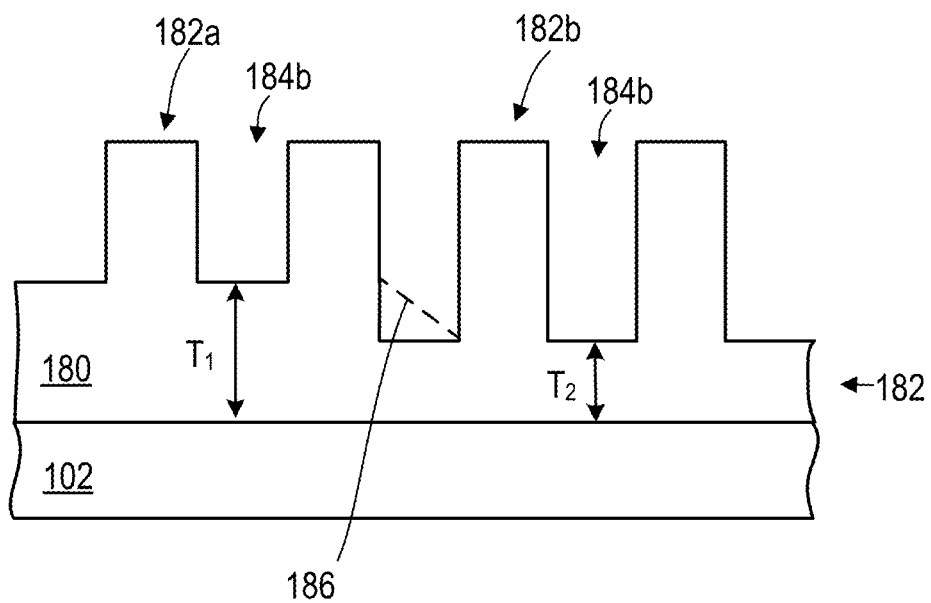
FIG. 3 illustrates a simplified side view of a substrate having a patterned layer with a varying residual layer thickness (RLT).

FIG. 3 illustrates a simplified side view of a substrate 102 having a patterned layer 180 with a varying RLT ($T_1$ and $T_2$). The residual layer 182 has an RLT that varies across the substrate according to a predetermined pattern. As illustrated the residual layer has a thickness, $T_1$, in one region and a different thickness, $T_2$, in another region. Furthermore, the profiles of the structures in the patterned layer 180 vary according to the variations in RLT across the patterned layer 180. For instance, the variation in the RLT creates shallow recessions 184a and deep recessions 184b which correspondingly change the aspect ratio of neighboring protrusions 182a, 182b.

According to the techniques described in more detail below, variations in RLTs across a patterned layer 180 can range from between 5 nm to 500 nm. That is, the difference between $T_1$ and $T_2$ can range from 5 nm to 500 nm. In some implementations, a residual layer 182 is fabricated to have an abrupt or step change in RLT, for example, as shown. In some implementations, a residual layer 182 is fabricated to have a gradual change in RLT as indicated by the dashed line 186.

In some implementations, a residual layer 182 is fabricated to have a uniform RLT (as in FIG. 2) but with protrusions 182a, 182b that have varying shapes, duty cycles, and/or pitches. Duty cycle refers to the ratio of the width of a protrusion 182a to an adjacent recession 184a. For example, using techniques disclosed herein features can be patterned such that the duty cycle of protrusion 182a to recession 184a is different from that of other protrusions and recessions while still maintaining a uniform RLT. Pitch refers to the total width of a protrusion 182a, 182b plus the width of an adjacent recession 184a, 184b. For example, using techniques disclosed herein features can be patterned such that the pitch of one set of protrusions and recessions is different from a neighboring set of protrusions and recessions while maintain a uniform RLT.

Figure 4A:
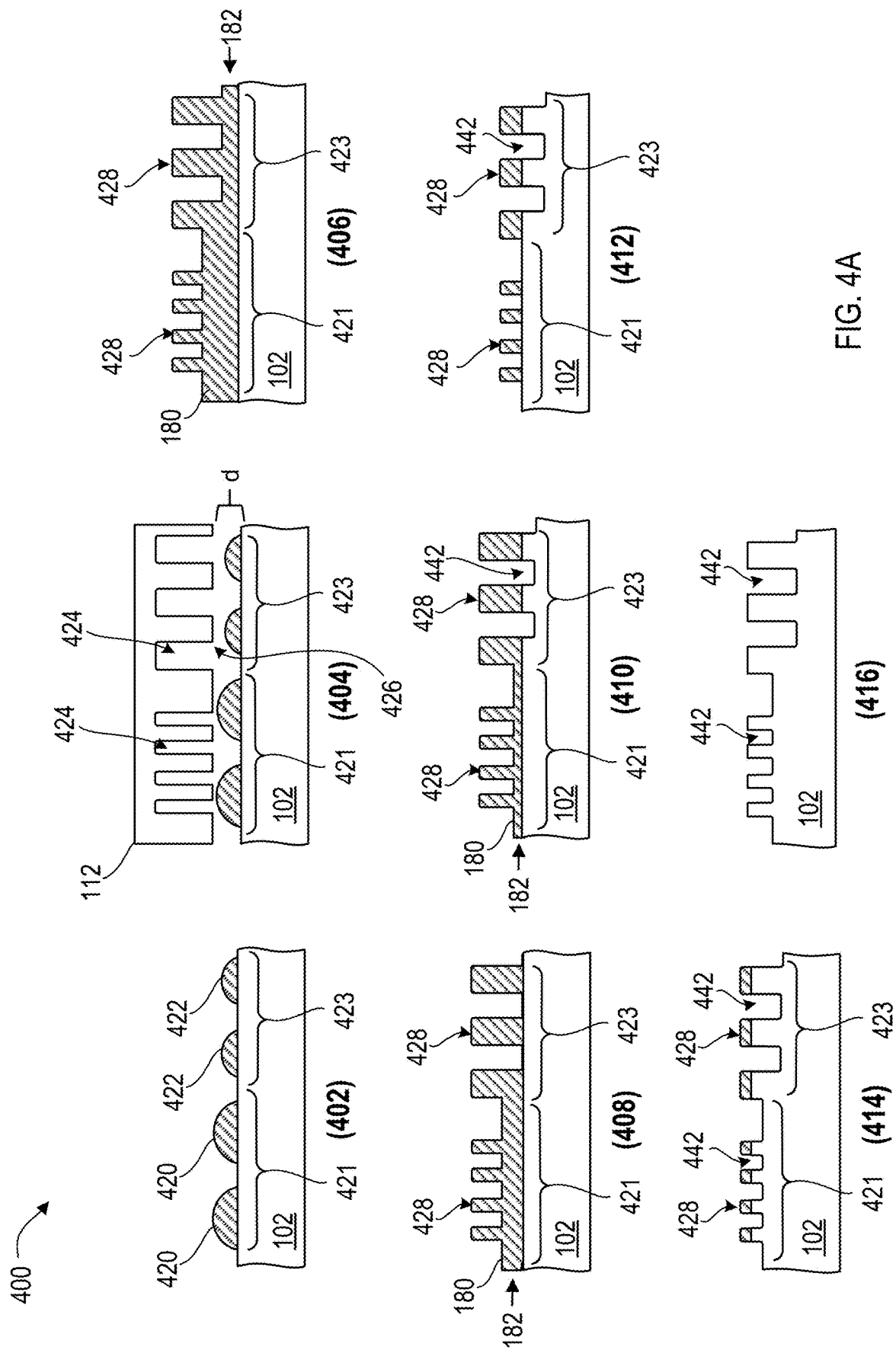
FIG. 4A illustrates an example process for fabricating variable RLT patterns and variable etch depth patterns in accordance with implementations of the present disclosure.

FIG. 4A illustrates an example process 400 for fabricating variable RLT patterns in an imprint fluid and variable etch depth patterns in a substrate. At step (402), a dispense system applies an imprint fluid to the substrate 102. The imprint fluid is applied to the surface of the substrate 102 according to a non-uniform pattern. The imprint fluid is applied such that the average volume per unit area of the imprint fluid varies across the substrate according to the predetermined pattern. The variation in volume of imprint fluid per unit area will, in part, determine the variations in the RLT of the patterned layer fabricated in the imprint fluid.

For example, the volume of imprint fluid dispensed on the substrate 102 can be varied by applying drops of imprint fluid 420, 422 in varying volumes. For example, a dispense system can apply large drops 420 in one region 421 of the substrate and smaller drops 422 in another region 423 of the substrate 102. Larger volumes of imprint fluid per unit area tend to produce larger RLTs, while lower volumes of imprint fluid per unit area tend to produce smaller RLTs. However, the size and depth of features in an imprint lithography template may also affect RLT. Various techniques for producing different imprint fluid dispense patterns are described in more detail below in reference to FIG. 5.

The imprint fluid can include, but is not limited to, a bulk imprint resist material such as isobornyl acrylate (IBOA), Medol 10, HDODA (hexanediol diacrylate), Irgacure 907, Darocur 4265, MASURF FS-2000 Surfactant 2, n-hexyl acrylate, ethylene glycol diacrylate, or 2-hydroxy-2-methyl-1-phenyl-propan-1-one.

The imprint fluid can be dispensed by a computer controlled dispense system, for example, a jetting dispense system, a spray dispense system, or a slot-die coating dispense system. For example, a jetting dispense system can be controlled to dispense droplets of imprint fluid on a substrate according to predetermined patterns by controlling droplet volumes as jetting head(s) are moved over the surface of a substrate. A spray dispense system can be controlled to dispense imprint fluid with varying volumes per unit area by controlling the motion of a stage on which the substrate is positioned while imprint fluid is dispensed onto the substrate. A slot-die coating system can be used with a stencil to dispense the imprint fluid according to a predefined pattern.

At step (404), an imprint lithography system applies a flexible template 112 to the imprint fluid 420, 422. That is, the flexible template 112 is brought into contact with the imprint fluid 420, 422. The flexible template includes features defined by recessions 424 in the surface 426 of the template 112. The recessions 424 can have varying shapes and sizes in order to form structures of corresponding shapes and sizes in the imprint fluid. Template 112 comes into contact with the imprint fluid, spreading the imprint fluid drops 420, 422, so as to generate a contiguous patterned layer 180 out of the imprint fluid on the substrate 102. For example, distance between the template and the substrate, "d," is reduced to allow imprint fluid on the substrate 102 to ingress into the recessions 424 in the surface 426 of the template 112.

After the desired volume of the template 112 is filled by the imprint fluid 420, 422, e.g., when the desired distance "d" is reached, the imprint fluid 420, 422 is solidified into a patterned layer 180. For example, the imprint fluid 420, 422 can be solidified by exposing the imprint fluid 420, 422 to a curing agent, for example, an ultraviolet (UV) energy source. The curing agent causes the imprint fluid to polymerize and cross-link.

At step (406), the template 112 is removed from the, now, solidified patterned layer 180. The patterned layer 180 includes structures 428 that correspond to respective recessions 424 in the template 112, and a residual layer 182. The thickness of the residual layer varies in relation to the volume of imprint fluid per unit area that was dispensed on each respective region of the substrate 102. Due to properties of the imprint fluid, the imprint fluid tends to preferentially fill the recessions 424 in the template 112 such that the residual layer 182 in each region is formed by the excess volume of imprint fluid that is not required to fill the template recessions 424. Consequently, the RLT in each region of the substrate 102 is related to the volume of imprint fluid per unit area dispensed in the region. In the example shown, region 421, where the large drops of imprint fluid 420 were dispensed has a thicker RLT than region 423 where the smaller drops of imprint fluid 422 were dispensed.

In some implementations, the imprint fluid can be applied in a predetermined pattern so as to fabricate a patterned layer 180 with a with structures 428 that have varying shapes, duty cycles, and/or pitches while maintaining a residual layer 182 having a uniform RLT (as discussed above in reference to FIGS. 2 and 3). For example, the volume of imprint fluid can be applied such that the duty cycle of one set of structures 428 is different from that of another neighboring set of structures 428 while still maintaining a uniform RLT. For example, the imprint fluid dispensing pattern may require applying more imprint fluid to an area of a substrate over which structures with a high duty cycle (e.g., wide structures and narrow recessions) is to be fabricated compared to an area over which structures with a low duty cycle are to be fabricated in order to account for the larger volume of imprint fluid which may be required to fill a corresponding portion of the template 112 for high duty cycle structures. Similarly, in some implementations, the volume of imprint fluid can be applied such that the pitch of one set of structures 428 is different from that of another neighboring set of structures 428 while still maintaining a uniform RLT.

In some implementations, the process 400 may be complete after forming the patterned layer 180. For example, in some applications, a patterned layer 180 of imprint fluid may be used to form an optical diffraction pattern. In other implementations, the patterned layer 180 and substrate 102 can be etched to form micro- or nano-structures 440 in the substrate 102 itself (e.g., see step (416)). The varying RLT of the patterned layer 180 can serve to produce a varying etch depth in the substrate 102 while etching the patterned layer 180 and substrate 102 at a uniform etch rate.

At steps (408)-(416), the patterned layer 180 and substrate 102 are etched. The patterned layer 180 and substrate 102 can be etched using etching processes including, but not limited to, a wet etch process, a plasma etching process, a dry etch process, or an ion beam etching/milling process. The etch process can be a uniform etch rate process. Steps (408)-(416) illustrate the formation of recessions 442 in the substrate 102 having varying etch depths as the patterned layer 180 and substrate 102 are etched. At step (408), the residual layer 182 in region 423 is completely etched away leaving the substrate surface in region 423 bare. At step (410), recessions 442 begin to form in the substrate 102 in region 423 while some of the residual layer 182 still remains in region 421. In addition, the remaining patterned layer 180 in region 423 the corresponds to the structures 428 in that region protects the underlying portions of the substrate 102 from being etched, thus, the substrate structures 440 begin to form in region 423. At step (412), the recessions 442 in region 423 are etched deeper and the surface of the substrate 102 becomes exposed in region 421. At step (414), recessions 442 begin to form in region 421 as the substrate 102 is etched in that region, while the remaining patterned layer 180 in regions 421 and 423 protect the portions of the substrate 102 that will form the substrate structures 440. At step (416), the process 400 is complete. The patterned layer 180 can be etched completely away, or, when the desired etch depth is reached, any remaining patterned layer 180 can be stripped from the substrate 102.

In some implementations, an etching process or etching material that has a non-uniform etch rate can be used to etch the patterned layer 180 and substrate 102. For example, the etch selectivity of the patterned resist layer and the substrate can be tuned to achieve etch selectivity ratios of patterned layer (e.g., resist) to substrate from 1:1 to 1:3. In other words, the substrate may be etched up to three times faster than the patterned layer.

Figure 4D:
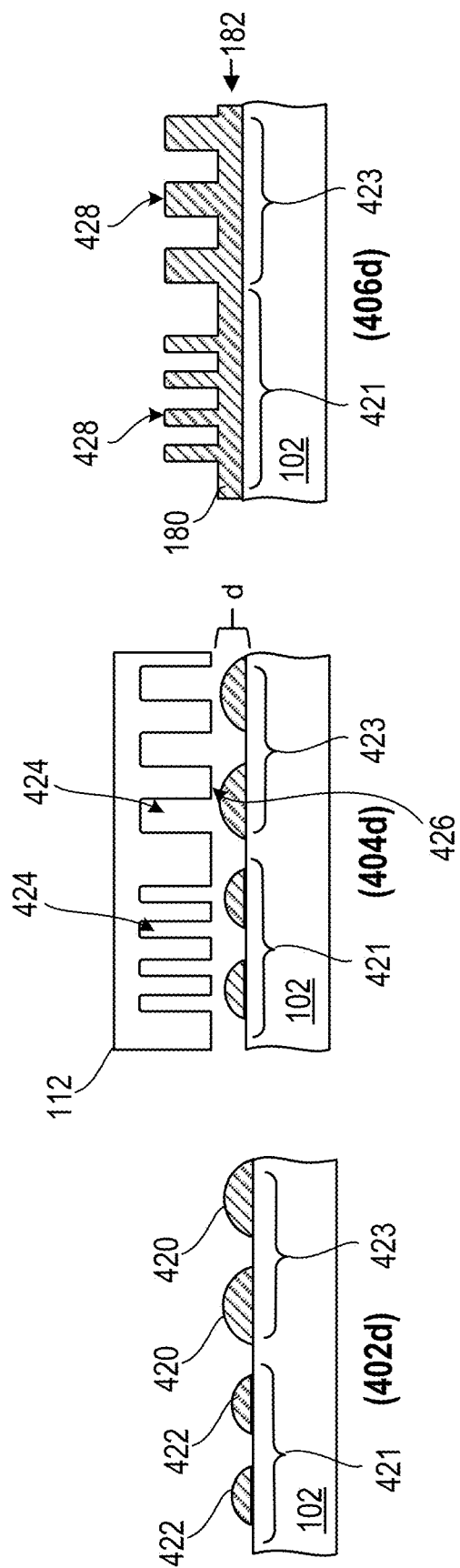

FIGS. 4B-4D each illustrate an example variation to steps (402)-(406) of process 400 that can be used to produce various different RLT patterns in an imprint fluid. FIG. 4B illustrates example steps (402b)-(406b) which can be used to produce different RLTs in regions 421 and 423 of the substrate 102 when a template 112 that has features (e.g., recessions 424) with similar dimensions in each region 422, 423 is used. Put differently, the technique illustrated in FIG. 4B will result in a variation in RLT across two regions of a patterned layer 180 when a template 112 with uniform features of uniform dimensions is applied to the both regions. At step (402b), the dispense system dispenses the imprint fluid in a pattern where the volume per unit area of imprint fluid is greater in region 421 than that in region 423. For example, drops 420 of imprint fluid applied in region 421 of the substrate are larger than the drops 422 applied in region 423 of the substrate 102.

At step (404b), a flexible template 112 that has recessions 424 with similar dimensions is applied by the imprint lithography system to the imprint fluid 420, 422. For example, the recessions 424 in the template 112 have similar volumes into with the imprint fluid 420, 422 can flow. When the flexible template 112 is brought into contact with the imprint fluid 420, 422, the fluid from each region 421, 423 fills the respective recessions 424 of the template 112. Because there is less imprint fluid per unit area in region 423 there will also be less fluid left on the substrate to form the residual layer 183 in region 423 once the respective template recessions 424 are filled. Consequently, after the imprint fluid 420, 422 is solidified and when the template 112 is removed, at step (406*b*) the, now, solidified patterned layer 180 will have a thinner RLT in region 423 than in region 421.

FIG. 4C illustrates example steps (402*c*)-(406*c*) which can be used to produce different RLTs in regions 422 and 423 of the substrate 102 when a template 112 that has features (e.g., recessions 424) with differing dimensions in each region 422, 423 is used. Put differently, the technique illustrated in FIG. 4C will result in a variation in RLT across two regions of a patterned layer 180 when a template 112 with features having different dimensions in each region 421, 423 is applied to a substrate 102. At step (402*c*), the dispense system dispenses the imprint fluid in a pattern where the volume per unit area of imprint fluid is relatively uniform across both region 421 and region 423. For example, drops 420 of imprint fluid applied in regions 421 and 423 have approximately the same volume.

At step (404*c*), the flexible template 112 that is applied by the imprint lithography system to the imprint fluid 420 has recessions 424 with smaller dimensions (e.g., smaller total volume) in region 421 and recessions 424 with larger dimensions (e.g., larger total volumes) in region 423. When the flexible template 112 is brought into contact with the imprint fluid 420, 422, the fluid from each region 421*b* 423 fills the respective recessions 424 of the template 112. Because the volumes of the recessions 424 applied to the imprint fluid in region 423 are larger than those of the recessions 424 applied to the imprint fluid in region 421, there will also be less fluid left on the substrate to form the residual layer 183 in region 423 once the respective template recessions 424 are filled. Consequently, after the imprint fluid 420 is solidified and when the template 112 is removed, at step (406*c*), the, now, solidified patterned layer 180 will have a thinner RLT in region 423 than in region 421.

The technique illustrated in FIG. 4C is similar to that illustrated in steps (402)-(406) of FIG. 4A except that a uniform volume of imprint fluid is used per unit area between the regions 421 and 423. Thus, the difference in RLT between regions 421 and 423 may be less than that show in FIG. 4A where a lesser volume of imprint fluid per unit area is applied in a region 423 in which the larger volume template recessions 424 are applied.

FIG. 4D illustrates example steps (402*d*)-(406*d*) which can be used to produce a uniform RLTs across regions 422 and 423 of the substrate 102 when applying a template 112 that has features (e.g., recessions 424) with differing dimensions in each region 422, 423. Put differently, the technique illustrated in FIG. 4B will result in a uniform RLT across two regions 421, 423 of a patterned layer 180 when a template 112 with features having different dimensions in each region is applied to a substrate 102. At step (402*d*), the dispense system dispenses the imprint fluid in a pattern where the volume per unit area of imprint fluid is greater in region 423 than that in region 421. For example, drops 420 of imprint fluid applied in region 423 of the substrate are larger than the drops 422 applied in region 421 of the substrate 102.

At step (404*d*), the flexible template 112 that is applied by the imprint lithography system to the imprint fluid 420, 422 has recessions 424 with smaller dimensions (e.g., smaller total volume) in region 421 and recessions 424 with larger dimensions (e.g., larger total volumes) in region 423. When the flexible template 112 is brought into contact with the imprint fluid 420, 422, the fluid from each region 421, 423 fills the respective recessions 424 of the template 112. The volume of imprint fluid 420, 422 applied in each region 421, 423 can be tailored to the dimensions of the template features (e.g., recessions 424) that will be patterned in each respective region 421, 423 so that there is sufficient imprint fluid in each region to fill the corresponding template structures while leaving approximately the same RLT in each region. For example, the volume of imprint fluid applied in region 421 would be equal to the volume needed for a desired RLT plus the volume required to fill the narrow recessions 424 of the portion of the template 112 that will be applied to region 421. Likewise, the volume of imprint fluid applied in region 423 would be equal to the volume needed to achieve an equivalent RLT to that in region 421 plus the volume required to fill the wide recessions 424 of the portion of the template 112 that will be applied to region 423. Consequently, after the imprint fluid 420, 422 is solidified and when the template 112 is removed, at step (406*d*) the, now, solidified patterned layer 180 will have a uniform RLT across regions 421 and 423, but structures 428 with different dimensions.

Although several variations in imprint fluid patterns and imprint lithography template patterns (e.g., feature geometries and dimensions) have been discussed, many additional combinations of imprint fluid and template patterns are within the scope of this disclosure and can be used to produce a variety of other patterns of structures and RLTs in patterned layers of an imprint fluid.

Figure 5:
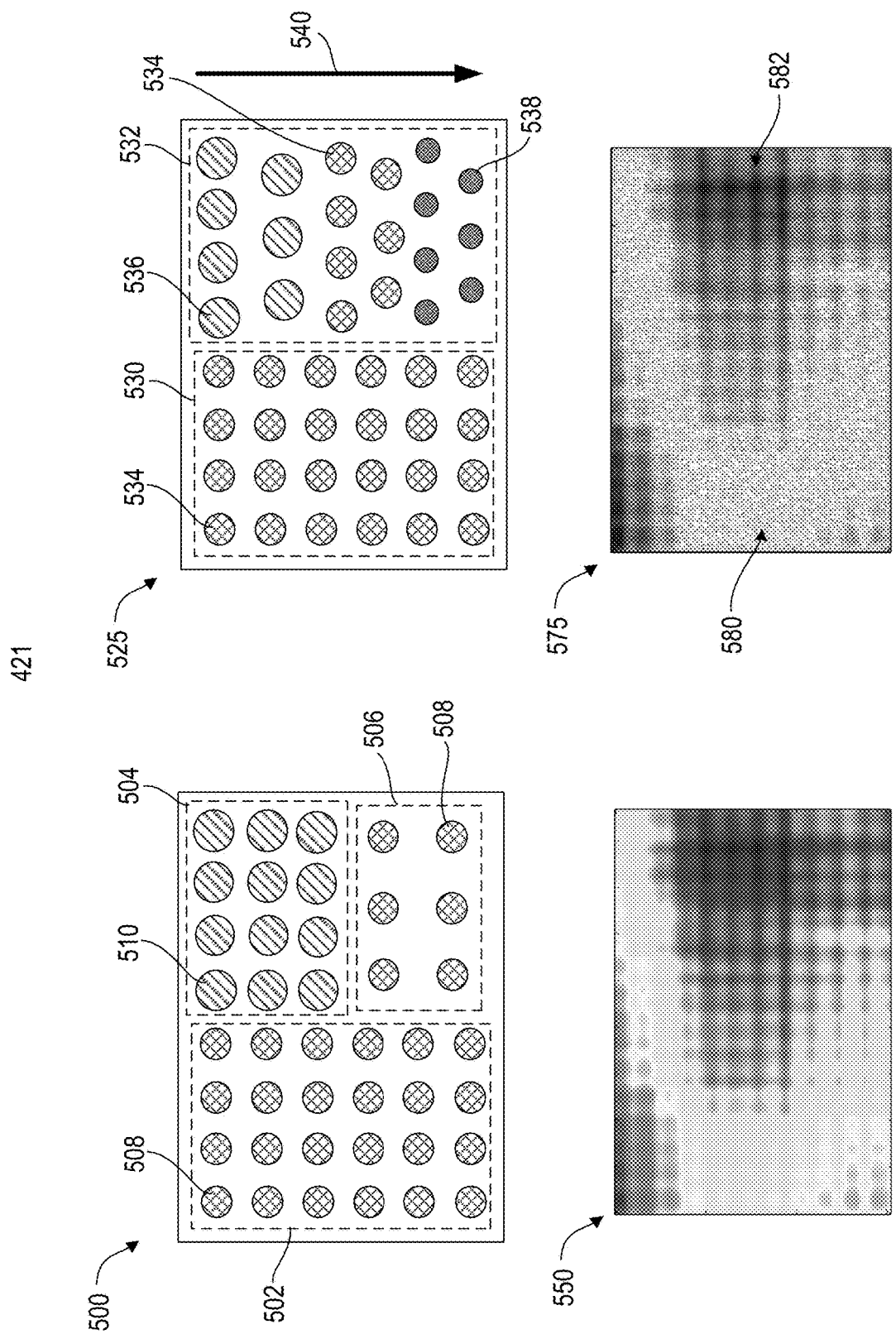
FIG. 5 illustrates top views of substrates with various example imprint fluid patterns in accordance with implementations of the present disclosure.

FIG. 5 illustrates top views of substrates with various example imprint fluid dispense patterns. Referring first to substrate 500, the imprint fluid can be dispensed according to fixed volumes per unit area in predetermined regions of the substrate. For example, substrate 500 includes three regions 502, 504, 506 each illustrating a different imprint fluid dispense pattern. Each region 502, 504, 506 includes a plurality of imprint fluid drops 508, 510 each having the same volume of imprint fluid. However, drops 508 in regions 502 and 506 have a less volume of imprint fluid than drops 510 in region 504. Furthermore, each region 502, 504, 506 has a fixed density of imprint fluid drops but a different volume per unit area of imprint fluid. Specifically, in the example shown, the volume per unit area of imprint fluid is a function of the drop density and drop size (or drop volume) in each region. Thus, the volume of imprint fluid per unit area may be varied between regions of a substrate by varying the drop density, drop volume, or both.

For example, region 504 has the greatest volume of imprint fluid per unit area, region 506 has the least volume of imprint fluid per unit area, and region 506 has a volume of imprint fluid per unit area that is less than region 504 but greater than region 506. The difference in the volume of imprint fluid per unit area between regions 502 and 504 is an example of varying the imprint fluid pattern by varying drop volume. That is, the difference in the volume of imprint fluid per unit area between regions 502 and 504 is defined by the volume of the imprint fluid drops 508, 510 in each respective region. For example, both regions 502 and 504 contain the same density of drops (e.g., number of drops per unit area), but the volume of drops 510 in region 504 is greater than that of drops 508 in region 502.

The difference in the volume of imprint fluid per unit area between regions 502 and 506 is an example of varying the imprint fluid pattern by varying drop density. That is, the difference in the volume of imprint fluid per unit area between regions 502 and 506 is defined by the density of the imprint fluid drops 508 in each respective region. For example, both regions 502 and 506 contain imprint fluid drops 508 having the same drop volume, but the density of drops 508 in region 506 is less than the density of drops 508 in region 502.

The difference in the volume of imprint fluid per unit area between regions 504 and 506 is an example of varying the imprint fluid pattern by varying both drop density and drop volume. That is, the difference in the volume of imprint fluid per unit area between regions 504 and 506 is defined by variations in both the volume of the imprint fluid drops 508, 510 and the density of drops 508, 510 in each respective region. For example, the drops 510 in region 504 have both a larger volume and are applied in a denser pattern than drops 508 in region 506.

Referring to substrate 525, the imprint fluid can be dispensed according to a varying volume per unit area in predetermined a region of the substrate. For example, substrate 525 includes two regions 530 and 532 each illustrating a different imprint fluid dispense pattern. Each region 530, 532 includes a plurality of imprint fluid drops 534, 536, 538. Region 530 has a fixed volume of imprint fluid per unit area (similar to region 502) and region 532 has a varying volume of imprint fluid per unit area. For example, region 532 has imprint fluid volume per unit area that forms a decreasing volume gradient in the direction of arrow 540. The gradient can be formed by varying the volume of drops in the region, the density of drops in the region, or both. Specifically, region 532 illustrates an example of varying the imprint fluid volume per unit area by varying both drop volume and drop density. As shown, the consecutive rows of imprint fluid drops decrease in both volume and density in the direction of arrow 540. Such a pattern can be used to create a continuous or near continuous gradient in RLT in a patterned layer.

Substrate 575 illustrates an example of an imprint fluid dispense pattern that corresponds with a diffraction efficiency output map 550 of a diffraction pattern. The brighter portions 580 of substrate 575 represent larger volume imprint fluid drops and the darker portions 582 represent smaller volume imprint fluid drops. The volume of imprint fluid per unit area dispensed on substrate 575 varies in accordance with the diffraction efficiency map 550. The diffraction efficiency map 550 can be, for example, generated from an imprint lithography diffraction pattern having a uniform RLT. The imprint fluid dispense pattern on substrate 575 can be generated such that the variations in RLT produced in an imprint lithography diffraction pattern produced by the dispense pattering on substrate 575 compensate for inefficiencies in the diffraction pattern produced from a uniform RLT diffracting pattern. For example, RLT variations can be produced from corresponding imprint fluid dispense patterns that compensate for non-uniformities in color and/or brightness distribution of uniform RLT diffraction patterns.

Figure 6:
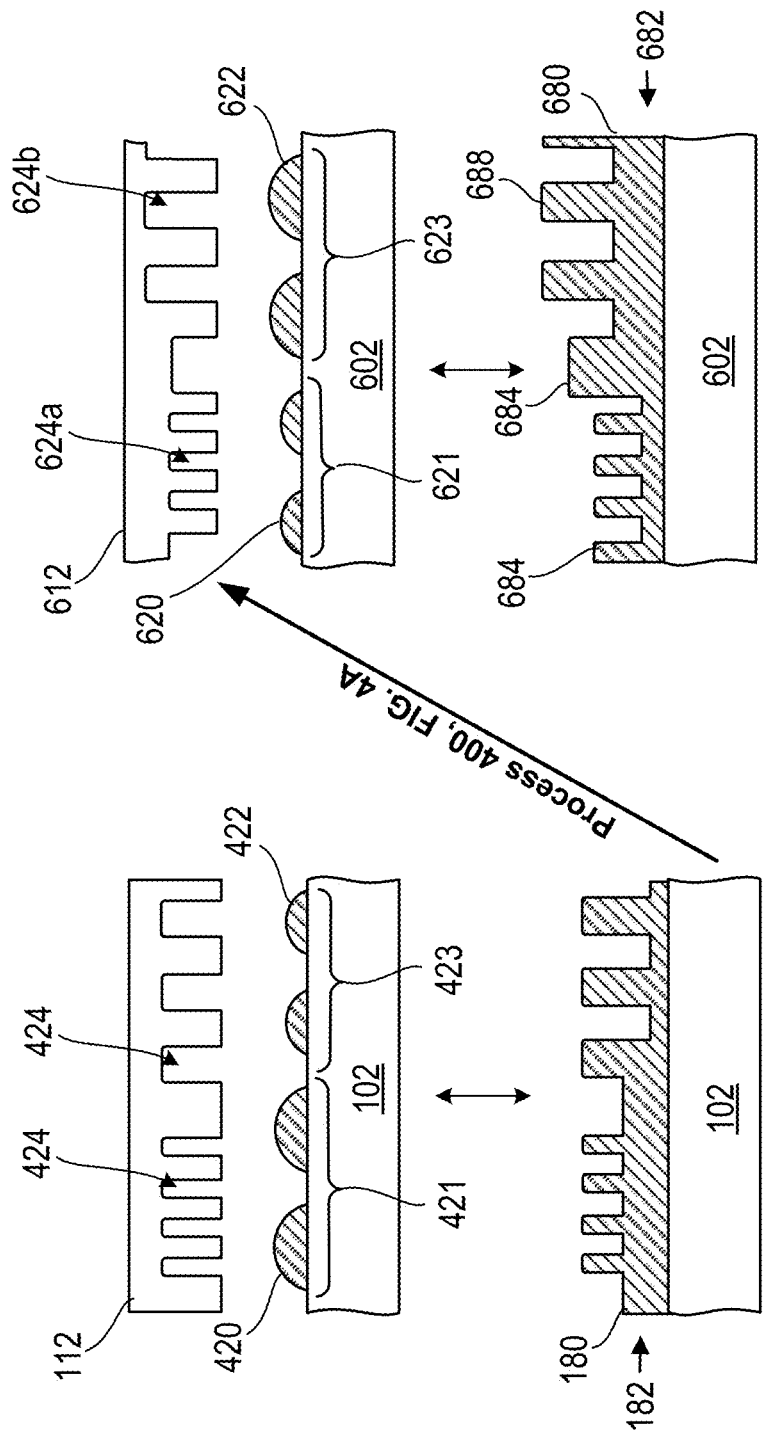
FIG. 6 illustrates several example imprint lithography template designs that can be used to produce variable RLT patterns in imprint fluid in accordance with implementations of the present disclosure.
Figure 7:
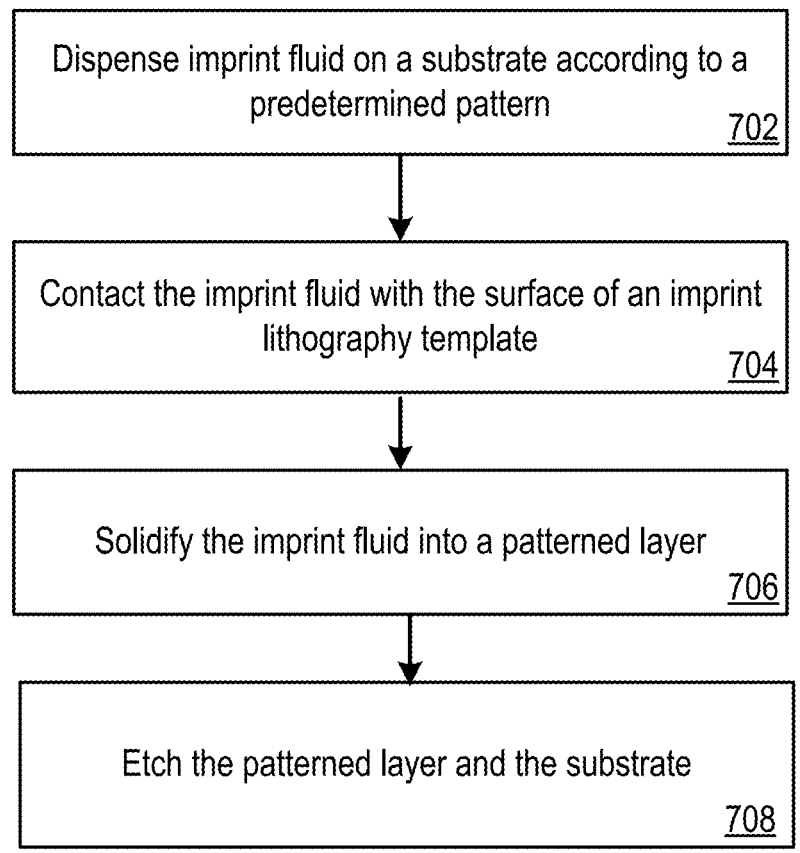
FIG. 7 shows a flowchart of an example method for fabricating variable RLT patterns and variable etch depth patterns in accordance with implementations of the present disclosure.

FIGS. 6 and 7 illustrate several example imprint lithography template designs that can be used to produce variable RLT patterns in imprint fluid. The templates may be master or sub-master templates. A master template is generally the first template produced with a new feature design in the surface. Master templates can be produced by, for example, electron beam lithography. A sub-master template is generally a replica or near-replica of a master template. A sub-master template can be produced from an imprint lithography and etching process, such as process 400 described above. More specifically, in some implementations, the process 400 can be used to produce a sub-master template that has variable etch depth features from a master template that has uniform etch depth features.

For example, referring to FIG. 6, the template 112 which was described in reference to FIG. 4A and process 400 can be a master template. As shown, template 112 includes a plurality of features (recessions 424) that have a uniform depth. The template 112 can be used in process 400 (discussed above) to create a patterned layer 180 that has a residual layer 182 with a varying RLT. In some implementations, the process 400 can be used to create a sub-master template 612 that has features 624a, 624b with varying etch depths from the master template 112. That is, when process 400 is complete (e.g., at step (416)), the etched substrate 102 shown in FIG. 4A may be a completed sub-master template (illustrated in FIG. 6 as template 612). Process 400 may then be repeated using the sub-master template 612, for example, to create more complex structural geometries and patterns in patterned layers, such as patterned layer 680.

For example, an imprint lithography dispense system can be used to apply imprint fluid to a new substrate 602. The volume of imprint fluid dispensed on the substrate 602 can be varied by applying drops of imprint fluid 620, 622 in varying volumes. For example, a dispense system can apply small drops 620 in one region 621 of the substrate and larger drops 622 in another region 623 of the substrate 602. The template 612 can be applied to the imprint fluid to from the patterned layer 680 and a curing agent applied to imprint fluid to solidify the patterned layer 680 (e.g., see step (404)). The combination of varying etch depth features 624a, 624b in the template 612 and the varying imprint fluid dispense volumes may be used to produce a patterned layer that has both a residual layer 682 with a varying RLT and structures 684, 686, 688 of varying height. If desired, the patterned layer 680 and substrate 602 can be etched (e.g., as described in reference to steps (408)-(416)) to transfer the pattern on the patterned layer 680 to the substrate 602.

In some implementations, when a sub-master template that has varying etch depth features 624a, 624b is used a varying RLTs can be created in a patterned layer even when a uniform volume of imprint fluid is applied. For example, the imprint lithography system can apply the imprint fluid to the new substrate 602 with a uniform volume. Thus, the volume and density of drops 620 and 622 can be uniform within the tolerances of the imprint system. Applying the template 612 to the imprint fluid to from the patterned layer 680 may produce a residual layer that has an RLT that varies in accordance with the dimensions of the features in the template. For example, the residual layer that has an RLT that varies in accordance with the volumes of the features in the template such as features with deeper etch depths.

In some implementations, the techniques described herein can be used to fabricate sub-master templates that include features with varying feature shape profiles such as stepped shape profiles. In some implementations, the sub-master templates fabricated using the techniques described herein can be used as templates for production of large volumes of patterned substrates.

FIG. 7 shows a flowchart of an example method 700 for fabricating variable RLT patterns and variable etch depth patterns in accordance with implementations of the present disclosure. The process 700 is illustrated as a collection of referenced acts arranged in a logical flow graph. The order in which the acts are described is not intended to be construed as a limitation, and any number of the described acts can be combined in other orders and/or in parallel to implement the process.

Imprint fluid is dispensed on a substrate according to a predetermined pattern (702). For example, an imprint lithography dispense system can be used to apply an imprint fluid to the substrate. The imprint fluid can be applied to the surface of the substrate according to a non-uniform pattern. For example, the imprint fluid can be applied such that the average volume per unit area of the imprint fluid varies across the substrate according to the predetermined pattern. Moreover, the average volume of imprint fluid per unit area can be varied according to several different techniques as discussed above.

The surface of an imprint lithography template is brought into contact with the imprint fluid (704). For example, an imprint lithography system can impress an imprint lithography template on the imprint fluid by superimposing the template over the fluid and reducing the distance between the template and substrate in order to contact the imprint fluid. The distance between the template and substrate can be further reduced until a desired distance is achieved that allows a desired amount of imprint fluid to flow into patterned recessions in the template.

The imprint fluid is solidified into a patterned layer (706). An imprint lithography system can solidify the imprint fluid into a patterned layer by exposing the imprint fluid to a curing agent. For example, after the desired distance between the template and the substrate is reached, the imprint fluid can be solidified by exposing the imprint fluid to a curing agent. The curing agent can be an energy source, e.g., a UV energy source that causes the imprint fluid to solidify by polymerizing and cross-linking.

The patterned layer and substrate are, optionally, etched (708). For example, after the patterned layer is solidified and the template is removed, the patterned layer and substrate can be etched. Example etching processes include, but not limited to, wet etch processes, plasma etching processes, dry etch processes, and ion beam etching/milling processes. The etch process can be a uniform etch rate process such that the patterned layer and underlying substrate are etched at the same rate (e.g. a 1:1 etch selectivity ratio). In some implementations, the etch selectivity of the patterned resist layer and the substrate can be tuned to achieve non-uniform etch rates between patterned layer (e.g., resist) and substrate. For example, the etch selectivity of the patterned resist layer and the substrate can be tuned to achieve etch selectivity ratios of patterned layer (e.g., resist) to substrate from 1:1 to 1:3.

Micro- and nano-patterns in imprint layers that have a residual layer that varies in thickness and features with varying etch depths in a substrate can be used to create diffraction patterns for use in optical devices. For example, diffraction patterns that include such micro- and nano-patterns may provide more efficient optical diffraction patterns for devices such as diffraction lenses or optical couplers used in optical wave guides.

Figure 8B:
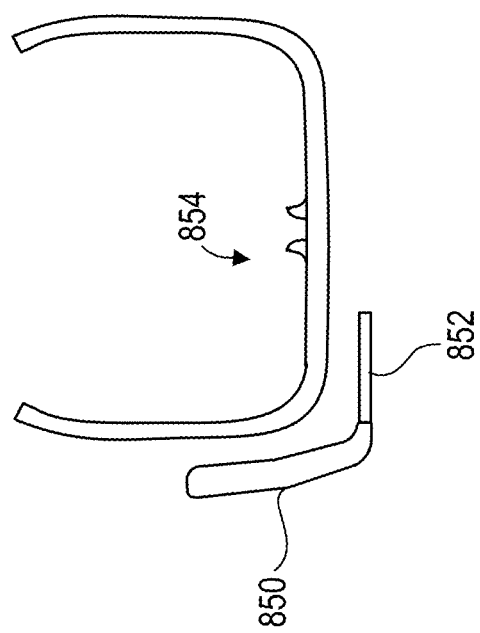
FIGS. 8A-8B show example devices in which patterns having variable RLTs or variable etch depth features can be used.
Figure 8A:
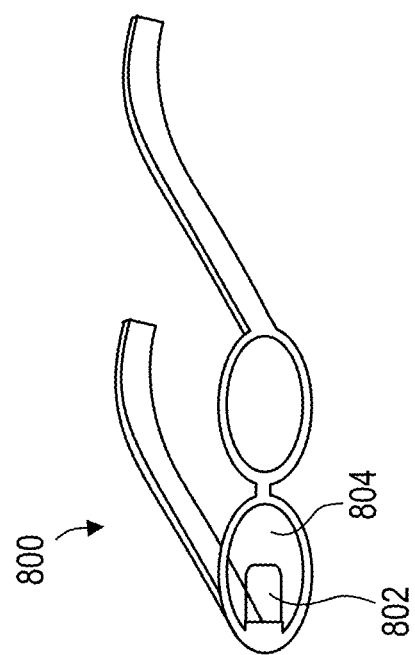

FIGS. 8A-8B show example devices in which asymmetric structures are used. FIG. 8A shows a perspective of example an optical system 800. The optical system 800 is, for example, an optical projection system illustrated as a pair of virtual reality or augmented reality glasses. The example optical system can include diffraction lenses and couplers to project an image on a lens 804 of the system 800. The system 800 can receive data representing image (e.g., from a processor) and project the image onto a region 802 on a lens 804 of the system 800. Accordingly, a user can view both an image projected in the region 802 as being overlaid on a scene that is visible through the lenses 804. Other example projection systems can include, but are not limited to, video projectors, mobile video projectors, heads-up displays (e.g., heads-up displays for vehicles), microscopes, telescopes, and other optical devices. In other example optical systems 900 asymmetric structures can be used in reflective polarizer films (e.g., GLAD Wire Grid Polarizers). For example, asymmetric structures can be used in reflective polarizing films for LCD display systems such as those used in smartphones, LCD monitors, LCD televisions, tablet computers, etc.

FIG. 8B shows a top view of a waveguide 850 for projecting an image within a lens 852 that can be positioned in front of a user's eye. For example, waveguide 850 can be attached to a pair of glasses 854 to provide augmented reality images to the user. The waveguide 850 receives image data from a processor and projects the an image within the lens 852 of the waveguide 850.

Diffraction lenses and optical couplers in the projection system 800 and the waveguide 850 can include diffraction patterns fabricated from a patterned layer of imprint fluid having varying RLTs or a patterned substrate having varying feature etch depths (as disclosed above). Diffraction patterns with varying RLTs or etch depths can be used to improve the diffraction efficiency of such lenses and optical couplers. For example, improved diffraction efficiency may result in brighter, more visible images to a user. Improved diffraction efficiency may also result in energy savings for augmented reality and other optical systems.

Although diffraction patterns are described in reference to optical systems, it should be understood that implementations of the present disclosure are not limited to diffraction patterns for visible light. Instead, the patterned layers and etched substrates described herein and processes to fabricate the same can be used to produce diffraction patterns for various electromagnetic waves having wavelengths corresponding to features of the fabricated structures. For example, the patterned layers and etched substrates described herein may be functional in diffraction patterns for electromagnetic waves ranging from infrared (IR) wavelengths to ultraviolet (UV) wavelengths, and potentially to X-rays.

While a number of examples have been described for illustration purposes, the foregoing description is not intended to limit the scope of the invention, which is defined by the scope of the appended claims. There are and will be other examples and modifications within the scope of the following claims.

The invention claimed is:

1. A method of fabricating a variable depth pattern, the method comprising:
   dispensing, on a surface of a substrate, an imprint fluid according to a predetermined pattern;
   contacting the imprint fluid with a surface of an imprint lithography template such that the imprint fluid fills features in the surface of the imprint lithography template; and
   solidifying the imprint fluid into a patterned layer, thereby forming, in the patterned layer:
      structures that correspond to the features of the imprint lithography template, and
      a residual layer having a residual layer thickness (RLT) that extends from the surface of the substrate to a base of a structure, wherein a first RLT of a first portion of the patterned layer is different from a second RLT of a second portion of the patterned layer,
   wherein the predetermined pattern is generated from an imprint lithography diffraction pattern having a uniform RLT.

2. The method of claim 1, wherein an RLT in a region between the first portion and the second portion varies gradually from the first RLT to the second RLT.

3. The method of claim 1, wherein a change in RLT from the first RLT to the second RLT is a step change in a region between the first portion and the second portion.

4. The method of claim 1, wherein dispensing the imprint fluid comprises dispensing the imprint fluid in a pattern of drops, wherein a volume of drops dispensed across the surface of the substrate varies according to the predetermined pattern.

5. The method of claim 4, wherein the pattern of drops corresponds to a fixed drop density in a predetermined region.

6. The method of claim 4, wherein the pattern of drops corresponds to a varying drop density in a predefined region.

7. The method of claim 1, wherein dispensing the imprint fluid comprises dispensing the imprint fluid with a jetting dispense system.

8. The method of claim 1, further comprising etching the patterned layer and the substrate, wherein a depth of features etched into the substrate varies according to variation in the RLT.

9. The method of claim 1, wherein the features in the imprint lithography template have a uniform feature depth.

10. The method of claim 9, wherein the imprint lithography template is a master template and, after etching, the substrate is a sub-master lithography template, and, wherein the method further comprises:
dispensing, on a surface of a second substrate, a second imprint fluid a volume of which is substantially uniform across the surface of the substrate; and
contacting the second imprint fluid with a surface of the sub-master template such that the imprint fluid fills features in the surface of the imprint lithography template, thereby forming, in the second imprint fluid, structures and a residual layer having a RLT that varies in accordance with variations in a dimension of features etched into the sub-master template.

11. The method of claim 1, wherein the features in the imprint lithography template have a varying feature depth.

12. The method of claim 1, wherein the predetermined pattern corresponds with a diffraction efficiency output map.

13. The method of claim 1, wherein the structures are nano-structures.

14. The method of claim 1, wherein the structures are micro-structures.

15. The method of claim 1, wherein a difference between the first RLT and the second RLT is between 5 nm and 500 nm.

16. A method of patterning an imprint fluid, the method comprising:
dispensing, on a surface of a substrate, the imprint fluid a volume of which varies across the surface of the substrate according to a predetermined pattern, wherein the predetermined pattern is generated from an imprint lithography diffraction pattern having a uniform RLT; and
contacting the imprint fluid with a surface of an imprint lithography template such that the imprint fluid fills features in the surface of the imprint lithography template, thereby forming, in the imprint fluid, structures and a residual layer having a residual layer thickness (RLT) that extends from the surface of the substrate to a base of a structure, wherein the RLT varies across the surface of the substrate according to the volume per unit area of the imprint fluid.

17. The method of claim 16, wherein dispensing the imprint fluid comprises dispensing the imprint fluid in a predefined pattern that corresponds to a volume needed to fill the features in the imprint lithography template.

18. An optical device comprising:
a substrate; and
a polymer imprint resist on a surface of the substrate, the polymer imprint resist comprising:
a plurality of structures forming a diffraction pattern; and
a residual layer having a residual layer thickness (RLT) that extends from the surface of the substrate to a base of a structure, wherein the RLT varies across the surface of the substrate according to a predefined pattern, and the predetermined pattern is generated from an imprint lithography diffraction pattern having a uniform RLT.

19. The device of claim 18, wherein variations in the RLT correspond with a diffraction efficiency mapping of a different diffraction grating having a uniform RLT.

20. The device of claim 18, wherein the polymer imprint resist is a Ultra Violet light curable Nano-Imprint Lithography (UV-NIL) resist.

* * * * *